United States Patent
Prest et al.

(10) Patent No.: US 10,052,848 B2
(45) Date of Patent: Aug. 21, 2018

(54) SAPPHIRE LAMINATES

(71) Applicant: Apple Inc., Cupertino, CA (US)

(72) Inventors: Christopher D. Prest, San Francisco, CA (US); Dale N. Memering, San Fransisco, CA (US); David A. Pakula, San Fransisco, CA (US); Richard Hung Minh Dinh, Cupertino, CA (US); Vincent Yan, San Francisco, CA (US); Jason Huey, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 13/783,262

(22) Filed: Mar. 2, 2013

(65) Prior Publication Data

US 2013/0236699 A1     Sep. 12, 2013

Related U.S. Application Data

(60) Provisional application No. 61/607,401, filed on Mar. 6, 2012.

(51) Int. Cl.
*C30B 33/06* (2006.01)
*C30B 29/30* (2006.01)
(Continued)

(52) U.S. Cl.
CPC ................ *B32B 9/002* (2013.01); *B32B 3/02* (2013.01); *B32B 7/00* (2013.01); *B32B 7/02* (2013.01); *B32B 17/10* (2013.01); *B32B 17/10045* (2013.01); *B32B 17/10119* (2013.01); *B32B 17/10733* (2013.01); *B32B 18/00* (2013.01); *C03C 27/00* (2013.01); *C04B 35/115* (2013.01); *C04B 37/001* (2013.01); *C04B 37/008* (2013.01); *C04B 37/047* (2013.01);
(Continued)

(58) Field of Classification Search
CPC ................ C30B 29/20; C30B 33/06
See application file for complete search history.

(56) References Cited

U.S. PATENT DOCUMENTS 2,248,955 A    7/1941  Capps
2,854,794 A   10/1958  Luedeman
(Continued)

FOREIGN PATENT DOCUMENTS

DE    202008002512 U1    6/2008
EP         0305626       3/1989
(Continued)

OTHER PUBLICATIONS

Schmid et al., Effect of Crystal Orientation and Temperature on the Strength of Sapphire, J. Am. Ceram. Soc., 81, 1998, p. 885-893. NPL_Schmid.*
(Continued)

*Primary Examiner* — Z. Jim Yang
(74) *Attorney, Agent, or Firm* — Brownstein Hyatt Farber Schreck, LLP

(57) ABSTRACT

Various sapphire and laminate structures are discussed herein. One embodiment may take the form of a sapphire structure having a first sapphire sheet with a first sapphire plane type forming the major surface and a second sapphire sheet having a second different sapphire plane type forming the major surface. The first and second sapphire sheets are fused together to form the sapphire structure.

11 Claims, 7 Drawing Sheets

(51) Int. Cl.
*B32B 9/00* (2006.01)
*B32B 3/02* (2006.01)
*B32B 7/00* (2006.01)
*B32B 18/00* (2006.01)
*B32B 7/02* (2006.01)
*B32B 17/10* (2006.01)
*C04B 35/115* (2006.01)
*C03C 27/00* (2006.01)
*C04B 37/00* (2006.01)
*C04B 37/04* (2006.01)
*C30B 29/20* (2006.01)

(52) U.S. Cl.
CPC ............. *C30B 29/20* (2013.01); *C30B 33/06* (2013.01); *B32B 2307/412* (2013.01); *C04B 2235/76* (2013.01); *C04B 2235/787* (2013.01); *C04B 2237/343* (2013.01); *C04B 2237/52* (2013.01); *C04B 2237/704* (2013.01); *Y10T 428/24488* (2015.01)

(56) References Cited

U.S. PATENT DOCUMENTS

| | | | |
|---|---|---|---|
| 3,658,631 A * | 4/1972 | Shaw | B32B 17/10174 428/415 |
| 3,753,775 A | 8/1973 | Robinson et al. | |
| 3,911,670 A * | 10/1975 | Hofer | 368/280 |
| 3,964,942 A | 1/1976 | Berkenblit et al. | |
| 4,008,111 A | 2/1977 | Rutz | |
| 4,054,895 A | 10/1977 | Ham | |
| 4,070,211 A | 1/1978 | Harari | |
| 4,085,302 A | 4/1978 | Zenk et al. | |
| 4,339,300 A | 7/1982 | Noble | |
| 4,393,578 A | 7/1983 | Cady et al. | |
| 4,459,038 A * | 7/1984 | Lederrey | G04B 45/0084 368/276 |
| 4,473,306 A * | 9/1984 | Lederrey | G04B 47/042 368/285 |
| 4,662,124 A | 5/1987 | Kato et al. | |
| 4,732,867 A | 3/1988 | Schnable | |
| 4,735,917 A | 4/1988 | Flatley et al. | |
| 4,775,641 A | 10/1988 | Duffy et al. | |
| 4,826,300 A | 2/1989 | Efron et al. | |
| 4,811,004 A | 3/1989 | Person et al. | |
| 4,849,299 A * | 7/1989 | Loth | C30B 33/00 427/527 |
| 4,908,074 A | 3/1990 | Hosoi et al. | |
| 4,946,546 A | 8/1990 | Bourgeois | |
| 5,069,743 A | 12/1991 | Wysocki et al. | |
| 5,151,389 A | 9/1992 | Zappella | |
| 5,154,023 A | 10/1992 | Sioshansi | |
| 5,377,669 A | 1/1995 | Schulz | |
| 5,413,360 A | 5/1995 | Atari et al. | |
| 5,427,051 A | 6/1995 | Maxwell et al. | |
| 5,441,591 A | 8/1995 | Imthurn et al. | |
| 5,451,553 A | 9/1995 | Scott et al. | |
| 5,543,630 A * | 8/1996 | Bliss et al. | 257/33 |
| 5,549,746 A | 8/1996 | Scott et al. | |
| 5,627,109 A | 5/1997 | Sassa et al. | |
| 5,661,313 A | 8/1997 | Dubbelday et al. | |
| 5,697,998 A | 12/1997 | Platus et al. | |
| 5,702,654 A | 12/1997 | Chen et al. | |
| 5,804,522 A | 9/1998 | Uegami | |
| 5,839,424 A | 11/1998 | Hauser | |
| 5,852,622 A | 12/1998 | Meissner et al. | |
| 5,877,094 A | 3/1999 | Egley et al. | |
| 5,904,136 A | 5/1999 | Nagatsuka et al. | |
| 6,012,303 A * | 1/2000 | Axelson | B32L 319/00 65/36 |
| 6,024,814 A | 2/2000 | Banzawa et al. | |
| 6,025,060 A * | 2/2000 | Meissner | C30B 33/00 117/1 |
| 6,028,711 A | 2/2000 | Adachi | |
| 6,028,762 A | 2/2000 | Kamitani | |
| 6,030,849 A | 2/2000 | Hasegawa et al. | |
| 6,038,079 A | 3/2000 | Michaels | |
| 6,119,673 A | 9/2000 | Nakaura | |
| 6,123,026 A * | 9/2000 | Gottlieb | F42B 10/46 102/293 |
| 6,159,285 A | 12/2000 | Toombs et al. | |
| 6,265,089 B1 | 7/2001 | Fatemi et al. | |
| 6,379,985 B1 | 4/2002 | Cervantes et al. | |
| 6,406,769 B1 | 6/2002 | Delabre | |
| 6,424,017 B2 | 7/2002 | Kurtz et al. | |
| 6,483,237 B2 | 11/2002 | Eastlund et al. | |
| 6,489,221 B2 | 12/2002 | Gehrke et al. | |
| 6,491,424 B1 * | 12/2002 | Tardy | G04B 39/00 368/283 |
| 6,514,576 B1 | 2/2003 | Kintaka et al. | |
| 6,524,162 B1 | 2/2003 | Hauser | |
| 6,547,722 B1 | 4/2003 | Higuma | |
| 6,586,819 B2 | 7/2003 | Matsuoka | |
| 6,642,989 B2 | 11/2003 | Umehara et al. | |
| 6,683,276 B2 | 1/2004 | Mosavi | |
| 6,775,073 B2 | 8/2004 | Fukazawa | |
| 6,809,010 B1 * | 10/2004 | Kinoshita | H01S 5/32341 372/45.01 |
| 6,818,532 B2 | 11/2004 | Moeggenborg et al. | |
| 6,819,693 B2 | 11/2004 | Derriey et al. | |
| 6,849,524 B2 | 2/2005 | Shelton et al. | |
| 6,852,253 B2 | 2/2005 | Tomioka | |
| 6,864,459 B2 | 3/2005 | Chang et al. | |
| 6,872,108 B2 | 3/2005 | Hsu | |
| 6,875,099 B2 | 4/2005 | Tatartchenko et al. | |
| 6,911,375 B2 | 6/2005 | Mack, III et al. | |
| 6,941,940 B1 | 9/2005 | Zavattari et al. | |
| 7,030,417 B2 | 4/2006 | Bakshi et al. | |
| 7,074,652 B2 | 7/2006 | Kumaran et al. | |
| 7,128,846 B2 | 10/2006 | Gaudin et al. | |
| 7,137,865 B2 | 11/2006 | Hammer et al. | |
| 7,151,045 B2 | 12/2006 | Hasegawa et al. | |
| 7,171,290 B2 | 1/2007 | Morinaga et al. | |
| 7,208,096 B2 | 4/2007 | Cherian et al. | |
| 7,255,740 B2 | 8/2007 | Sprenger et al. | |
| 7,268,741 B2 | 9/2007 | Sarabandi et al. | |
| 7,285,168 B2 | 10/2007 | Bradaczek et al. | |
| 7,390,702 B2 | 6/2008 | Nakamura | |
| 7,495,615 B2 | 2/2009 | Yamanaka et al. | |
| 7,499,093 B2 | 3/2009 | Campbell | |
| 7,561,351 B2 | 7/2009 | Konno | |
| 7,619,567 B2 | 11/2009 | Lynch et al. | |
| 7,663,189 B2 | 2/2010 | Fukuda | |
| 7,683,838 B2 | 3/2010 | Koyama et al. | |
| 7,883,557 B2 | 2/2011 | Liu et al. | |
| 7,902,474 B2 | 3/2011 | Mittleman et al. | |
| 7,943,953 B2 | 5/2011 | Sakamoto et al. | |
| 7,956,356 B2 | 6/2011 | Tanikella et al. | |
| 7,977,587 B2 | 7/2011 | Rajagopal et al. | |
| 8,003,189 B2 | 8/2011 | Jones et al. | |
| 8,070,546 B2 | 12/2011 | Joo et al. | |
| 8,157,912 B2 | 4/2012 | Wei | |
| 8,158,900 B2 | 4/2012 | Maatta | |
| 8,197,303 B2 | 6/2012 | Tanikella et al. | |
| 8,259,901 B1 | 9/2012 | Kamireddi | |
| 8,268,656 B2 | 9/2012 | Kajiyama | |
| 8,390,023 B2 | 3/2013 | Armitage et al. | |
| 8,455,879 B2 | 6/2013 | Tanikella et al. | |
| 8,624,759 B2 | 1/2014 | Maenpaa et al. | |
| 8,721,917 B2 | 5/2014 | Cherian et al. | |
| 8,894,868 B2 | 11/2014 | Hooper et al. | |
| 9,154,678 B2 | 10/2015 | Kwong et al. | |
| 9,221,289 B2 | 12/2015 | Prest et al. | |
| 9,225,056 B2 | 12/2015 | Pope et al. | |
| 9,232,672 B2 | 1/2016 | Kwong et al. | |
| 9,346,130 B2 | 5/2016 | Lei et al. | |
| 9,716,815 B2 | 7/2017 | Kwong et al. | |
| 9,718,249 B2 * | 8/2017 | Kwong | B32B 3/00 |
| 2002/0017653 A1 | 2/2002 | Chuang | |
| 2002/0167068 A1 | 11/2002 | Hsu et al. | |
| 2002/0168837 A1 | 11/2002 | Hsu et al. | |
| 2002/0176075 A1 * | 11/2002 | Fukazawa | C30B 29/20 356/246 |

(56) References Cited

U.S. PATENT DOCUMENTS

| | | | |
|---|---|---|---|
| 2004/0191504 A1* | 9/2004 | Stevenson | B05D 1/185 428/332 |
| 2005/0188916 A1* | 9/2005 | Riman | C01G 23/003 117/21 |
| 2006/0003587 A1 | 1/2006 | Hsu et al. | |
| 2006/0043396 A1 | 3/2006 | Tsuda et al. | |
| 2006/0055619 A1 | 3/2006 | Sarabandi et al. | |
| 2006/0162849 A1* | 7/2006 | Han | C03C 27/06 156/153 |
| 2006/0196849 A1 | 9/2006 | Moeggenborg et al. | |
| 2007/0193986 A1 | 8/2007 | Schulz et al. | |
| 2007/0204493 A1* | 9/2007 | Foley | B41M 5/502 40/299.01 |
| 2008/0053959 A1* | 3/2008 | Tong | H01L 21/0206 216/67 |
| 2008/0075941 A1* | 3/2008 | Tatartchenko | C30B 15/14 428/220 |
| 2008/0090382 A1* | 4/2008 | Fujii | B23K 26/0057 438/463 |
| 2008/0090582 A1* | 4/2008 | Chang et al. | 455/452.1 |
| 2008/0145632 A1 | 6/2008 | Nagami | |
| 2008/0164578 A1* | 7/2008 | Tanikella | C30B 29/20 257/628 |
| 2008/0264767 A1 | 10/2008 | Chen et al. | |
| 2008/0305005 A1* | 12/2008 | Kurokawa | B01J 19/0093 422/68.1 |
| 2009/0035504 A1* | 2/2009 | Pishchik | C30B 29/20 428/53 |
| 2009/0049773 A1* | 2/2009 | Zadesky | B32L 317/10018 52/204.62 |
| 2009/0098807 A1 | 4/2009 | Bakshi et al. | |
| 2009/0104409 A1* | 4/2009 | Derriey | C03C 17/04 428/172 |
| 2009/0130415 A1* | 5/2009 | Mack, III | C30B 15/34 428/220 |
| 2009/0173769 A1* | 7/2009 | Bray | B23K 20/1205 228/112.1 |
| 2009/0237874 A1* | 9/2009 | Prest | H05K 5/0239 361/679.01 |
| 2009/0268019 A1 | 10/2009 | Ishii | |
| 2009/0321234 A1 | 12/2009 | Yu et al. | |
| 2010/0026945 A1* | 2/2010 | Tan | G02F 1/133632 349/119 |
| 2010/0092728 A1 | 4/2010 | Hasegawa et al. | |
| 2010/0136306 A1* | 6/2010 | Adachi | B32L 315/01 428/212 |
| 2010/0193664 A1* | 8/2010 | Stoddard | C30B 11/14 249/114.1 |
| 2010/0215890 A1* | 8/2010 | Lee | B32B 37/003 428/64.1 |
| 2011/0019123 A1* | 1/2011 | Prest et al. | 349/58 |
| 2011/0019354 A1 | 1/2011 | Prest et al. | |
| 2011/0062394 A1 | 3/2011 | Kumaran et al. | |
| 2011/0168005 A1* | 7/2011 | Pluen | B32L 317/10045 89/36.02 |
| 2011/0177300 A1 | 7/2011 | Hankey et al. | |
| 2011/0195560 A1 | 8/2011 | Gaudin et al. | |
| 2011/0223840 A1 | 9/2011 | Morinaga et al. | |
| 2012/0000415 A1* | 1/2012 | D'Evelyn | C30B 25/02 117/94 |
| 2012/0001027 A1* | 1/2012 | Jones | B32L 317/10009 244/171.7 |
| 2012/0038471 A1 | 2/2012 | Kim et al. | |
| 2012/0068213 A1* | 3/2012 | Zhang | B32L 318/00 257/98 |
| 2012/0088099 A1 | 4/2012 | Tosatti et al. | |
| 2012/0111726 A1 | 5/2012 | Couto Petri et al. | |
| 2012/0118228 A1 | 5/2012 | Lee et al. | |
| 2012/0135177 A1 | 5/2012 | Cornejo et al. | |
| 2012/0171450 A1* | 7/2012 | Ozaki | C04B 35/111 428/220 |
| 2012/0212890 A1 | 8/2012 | Hoshino et al. | |
| 2012/0229424 A1 | 9/2012 | Behles et al. | |
| 2012/0309632 A1* | 12/2012 | Goyal | C30B 15/34 505/230 |
| 2013/0078398 A1* | 3/2013 | Weber | B32L 337/144 428/34.1 |
| 2013/0102359 A1 | 4/2013 | Ho | |
| 2013/0209740 A1* | 8/2013 | Henley | C30B 29/20 428/156 |
| 2013/0237402 A1 | 9/2013 | Wang et al. | |
| 2014/0083353 A1 | 3/2014 | Pope et al. | |
| 2014/0139978 A1* | 5/2014 | Kwong | H04M 1/0202 361/679.01 |
| 2014/0255704 A1* | 9/2014 | Krell | C30B 29/26 428/432 |
| 2016/0087332 A1 | 3/2016 | Pope et al. | |
| 2017/0001266 A1 | 1/2017 | Li et al. | |
| 2017/0285686 A1 | 10/2017 | Kwong et al. | |

FOREIGN PATENT DOCUMENTS

| | | |
|---|---|---|
| EP | 1013802 | 6/2000 |
| EP | 1829846 | 9/2007 |
| EP | 2520401 | 11/2012 |
| GB | 1135886 | 12/1968 |
| JP | 54032062 | 3/1979 |
| JP | 1173764 | 7/1989 |
| JP | 2039578 | 2/1990 |
| JP | 3021048 | 1/1991 |
| JP | 03115200 | 5/1991 |
| JP | 3177335 | 8/1991 |
| JP | 3250659 | 11/1991 |
| JP | 5027257 | 2/1993 |
| JP | 5085894 | 4/1993 |
| JP | 05085894 A * | 4/1993 |
| JP | 5313103 | 11/1993 |
| JP | 5333164 | 12/1993 |
| JP | 5335435 | 12/1993 |
| JP | 06242260 | 9/1994 |
| JP | 6314694 | 11/1994 |
| JP | 06337292 | 12/1994 |
| JP | 7129952 | 5/1995 |
| JP | 07145000 | 6/1995 |
| JP | 07206600 A * | 8/1995 |
| JP | 8040797 | 2/1996 |
| JP | 8148594 | 6/1996 |
| JP | 09008690 | 1/1997 |
| JP | H0933456 | 2/1997 |
| JP | 9213773 | 8/1997 |
| JP | 9270565 | 10/1997 |
| JP | 9295895 | 11/1997 |
| JP | 10239520 | 9/1998 |
| JP | 10269543 | 10/1998 |
| JP | 10275955 | 10/1998 |
| JP | 10335259 | 12/1998 |
| JP | 2849602 B * | 1/1999 |
| JP | 11135889 | 5/1999 |
| JP | 2000183203 | 6/2000 |
| JP | 2000196149 | 7/2000 |
| JP | 2001134927 | 5/2001 |
| JP | 2001176993 | 6/2001 |
| JP | 2001237335 | 8/2001 |
| JP | 2001298170 | 10/2001 |
| JP | 2002015977 | 1/2002 |
| JP | 2002109854 | 4/2002 |
| JP | 2002184845 | 6/2002 |
| JP | 2002201096 | 7/2002 |
| JP | 2002255694 | 9/2002 |
| JP | 2002289529 | 10/2002 |
| JP | 2002293692 | 10/2002 |
| JP | 2003015156 | 1/2003 |
| JP | 2003069176 | 3/2003 |
| JP | 2003133802 | 5/2003 |
| JP | 2003137690 | 5/2003 |
| JP | 2003245847 | 9/2003 |
| JP | 2003277194 | 10/2003 |
| JP | 2003282551 | 10/2003 |
| JP | 2003332234 | 11/2003 |
| JP | 2004111848 | 4/2004 |
| JP | 2004168622 | 6/2004 |

(56) References Cited

FOREIGN PATENT DOCUMENTS

| | | |
|---|---|---|
| JP | 2004288934 | 10/2004 |
| JP | 2004296575 | 10/2004 |
| JP | 2004296701 | 10/2004 |
| JP | 2004296912 | 10/2004 |
| JP | 2005047718 | 2/2005 |
| JP | 2005064492 | 3/2005 |
| JP | 2005079171 | 3/2005 |
| JP | 2005085888 | 3/2005 |
| JP | 2005101230 | 4/2005 |
| JP | 2005104742 | 4/2005 |
| JP | 2005136106 | 5/2005 |
| JP | 2005150523 | 6/2005 |
| JP | 2005277334 | 10/2005 |
| JP | 2005285869 | 10/2005 |
| JP | 2005314121 | 11/2005 |
| JP | 2006016230 | 1/2006 |
| JP | 2006016239 | 1/2006 |
| JP | 2006062931 | 3/2006 |
| JP | 2006066442 | 3/2006 |
| JP | 2006232639 | 9/2006 |
| JP | 2006232640 | 9/2006 |
| JP | 2006339308 | 12/2006 |
| JP | 2007010730 | 1/2007 |
| JP | 2007150072 | 6/2007 |
| JP | 2007237627 | 9/2007 |
| JP | 2007237628 | 9/2007 |
| JP | 2007269577 | 10/2007 |
| JP | 2008111984 | 5/2008 |
| JP | 2008211040 | 9/2008 |
| JP | 2008297150 | 12/2008 |
| JP | 2009040639 A * | 2/2009 |
| JP | 2009263534 | 11/2009 |
| JP | 2010056485 | 3/2010 |
| JP | 2011241190 | 12/2011 |
| KR | 20100090897 | 8/2010 |
| TW | 200909216 | 3/2009 |
| TW | 201117248 | 5/2011 |
| TW | M438642 | 10/2012 |
| WO | WO98/56575 | 12/1998 |
| WO | WO02/054718 | 7/2002 |
| WO | WO2004/059731 | 7/2004 |
| WO | WO2007/143480 | 12/2007 |
| WO | WO2008/036888 | 3/2008 |
| WO | WO2008/093704 | 8/2008 |
| WO | WO2008/122296 | 10/2008 |
| WO | WO2009/025842 | 2/2009 |
| WO | WO2009/151160 | 12/2009 |
| WO | WO2010/057842 | 2/2010 |
| WO | WO2010/090116 | 8/2010 |

OTHER PUBLICATIONS

Watanabe., Twinned Crystals of Corundum Grown from Cryolite Flux, Cryst. Res. Technol., vol. 24, 1989, pp. 1197-1205.*
Machine Translation of JP 2849602 B, obtained form Industrial Property Digital Library of the JPO on Apr. 29, 2015.*
Machine translation of JP2009/040639 A, obtained from Industrial Property Digitial Library of the JPO on Jul. 25, 2017.*
Chapter 2 of Sapphire: Material, Manufacturing, Applications, 2009.*
U.S. Appl. No. 14/178,623, filed Feb. 12, 2014, Benjamin J. Pope et al.
U.S. Appl. No. 14/103,661, filed Dec. 11, 2013, Kelvin Kwong et al.
U.S. Appl. No. 13/738,107, filed Jan. 10, 2013, Kelvin Kwong et al.
U.S. Appl. No. 13/560,791, filed Jul. 27, 2012, Christopher D. Prest et al.
Quick, Darren, "Aston Martin teams with Mobiado for transparent touchscreen concept phone," Mar. 28, 2011, pp. 1-5, retrieved from the internet: URL:http://www-gizmag.com/cpt002-aston-martin-concept-phone/18248.
Zahler, James, "Sapphire and GaN Substrate Materials," DOE SSL Manufacturing R&D Workshop 2012, Presentation, Apr. 14, 2012, pp. 1-19.
Flores, Marc, "Can a Case Scratch the iPhone 4's Glass and Shatter it?," Oct. 8, 2010, pp. 1-10, retrieved from the internet: URL:http://www.intomobile.com/2010/10/08/glassgate-iphone-4.
Sykes, Neil, "The Use of Lasers in Target Manufacture," 2010, pp. 1-24, retrieved from the internet: URL:heep://wwwstfc.ac.uk/CLF/resources/PDF/events_3effw_weds_sykes.pdf.
International Search Report and Written Opinion, PCT Application No. PCT/US2013/0049444, 24 pages, dated Feb. 28, 2014.
International Search Report and Written Opinion, PCT Application No. PCT/US2014/0010145, 11 pages, dated Apr. 4, 2014.
Invitation to Pay Additional Fees, PCT Application No. PCT/US2013/028938, 6 pages, dated May 29, 2013.

* cited by examiner

SAPPHIRE LAMINATES

CROSS-REFERENCE TO RELATED APPLICATIONS

This application claims priority to U.S. Provisional Patent Application No. 61/607,401, filed Mar. 6, 2012, and entitled, "Sapphire Laminates," the entirety of which is incorporated herein by reference.

TECHNICAL FIELD

The present application relates generally to sapphire and, more particularly, to thin sapphire laminates.

BACKGROUND

Corundum is a crystalline form of aluminum oxide and is found in various different colors, all of which are generally commonly referred to as sapphire except for red corundum which is commonly known as ruby and pinkish-orange corundum which is known as padparadscha. Transparent forms of corundum are considered precious stones or gems. Generally, corundum is extraordinarily hard with pure corundum defined to have 9.0 Mohs and, as such, is capable of scratching nearly all other minerals. For the present purposes, the terms "corundum" and "sapphire" may be used interchangeably to refer generally to the crystalline form of aluminum oxide.

As may be appreciated, due to certain characteristics of corundum, including its hardness and transparent characteristics, among others, it may be useful in a variety of different applications. However, the same characteristics that are beneficial for particular applications commonly increase both the cost and difficulty in processing and preparing the sapphire for those applications. As such, beyond costs associated with it being a precious stone, the costs of preparing the corundum for particular uses is often prohibitive. For example, the sapphire's hardness makes cutting and polishing the material both difficult and time consuming when conventional processing techniques are implemented. Further, conventional processing tools such as cutters experience relatively rapid wear when used on corundum.

SUMMARY

Various sapphire structure and laminate structures are discussed herein. One embodiment may take the form of a sapphire structure having a first sapphire sheet with a first sapphire plane type forming the major surface and a second sapphire sheet having a second different sapphire plane type forming the major surface. The first and second sapphire sheets are fused together to form the sapphire.

Another embodiment may take the form of a sapphire laminate having a first sapphire sheet and a second sapphire sheet fused to the first sapphire sheet. The first and second sapphire sheets have the same crystal orientation with respect to their major surfaces, but different crystal orientations with respect to their edges. That is, the first and second sapphire sheets may have a common sapphire plane forming the major surface and different sapphire planes forming the secondary surfaces.

Yet another embodiment may take the form of a glass structure having a glass sheet and a sapphire sheet adhered to the glass sheet. The glass structure is less than or approximately equal to 1 mm thick.

Still another embodiment may take the form of a method of manufacturing a laminate structure. The method includes lapping and polishing a first side of a sapphire sheet and adhering the sapphire sheet to a glass sheet. The method also includes lapping and polishing a second side of the sapphire sheet and chemically strengthening the glass sheet.

Further still, another embodiments may include the use of a sapphire outer surface with a glass inner surface for the display of a consumer electronics device, where the two sapphire surfaces are laminated together with the glass providing support for the display and the sapphire providing scratch resistance and durability advantages.

While multiple embodiments are disclosed, still other embodiments of the present invention will become apparent to those skilled in the art from the following Detailed Description. As will be realized, the embodiments are capable of modifications in various aspects, all without departing from the spirit and scope of the embodiments. Accordingly, the drawings and detailed description are to be regarded as illustrative in nature and not restrictive.

DETAILED DESCRIPTION

Sapphire laminates are discussed herein that take advantage of the characteristics of sapphire. In particular, sapphire is anisotropic and the crystalline structure of sapphire has multiple different planes. Although each plane exhibits significant hardness over other minerals, some planes may have additional, different characteristics. For example, while C-plane sapphire may be harder than other sapphire planes, A-plane sapphire may have a higher modulus of rupture than other planes. R-plane and M-plane sapphire may provide other advantages.

In some embodiments, two sapphire sheets having different sapphire planes are fused together to take advantage of the different characteristics of the different planes. In other embodiments, a secondary orientation of the sapphire sheets is controlled so that the edges may have different planes. In other embodiments a sapphire sheet maybe laminated over another material. For example, in one embodiment, a sapphire sheet may be adhered to a glass sheet.

Further, handling and processing sapphire sheets that are approximately one millimeter or less is difficult as it requires increased care to prevent breakage. More particularly, handling sapphire sheets less than approximately 0.5 millimeters (such as 0.4 millimeter sheets) typically results in increased breakage of the sapphire sheets. In accordance with techniques discussed herein, sapphire structures and/or sapphire laminates on glass allow creation of sheets of approximately one millimeter or less in thickness. Moreover, in the case of laminating glass with sapphire, the use of glass may provide cost savings over using sapphire, as sapphire is generally more expensive to obtain and/or process than glass. The sapphire laminate provides increased hardness to prevent wear, scratching and/or damage to the glass.

Figure 1:
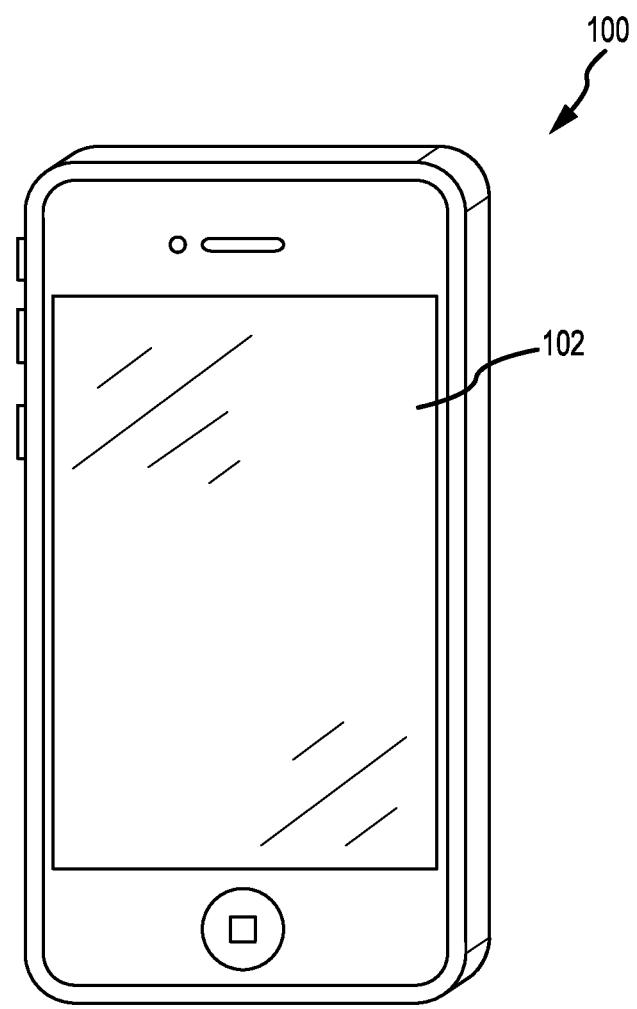
FIG. 1 illustrates an electronic device having a sapphire cover plate.

Turning to FIG. 1, an example electronic device 100 is illustrated in which a sapphire structure or laminate may be implemented. For example, a sapphire laminate 102 may be utilized as a cover glass and/or back plate of the device 100. Additionally, or alternatively, a sapphire laminate may be utilized as a cover and/or lens for a camera of the device. It should be appreciated that the sapphire laminates may be utilized in various different devices. For example, they may be used for windows, mirrors, cover glass, lenses and so forth in cameras, computers, mobile devices, watches, display devices, touch screens and clocks among other things.

Figure 2:
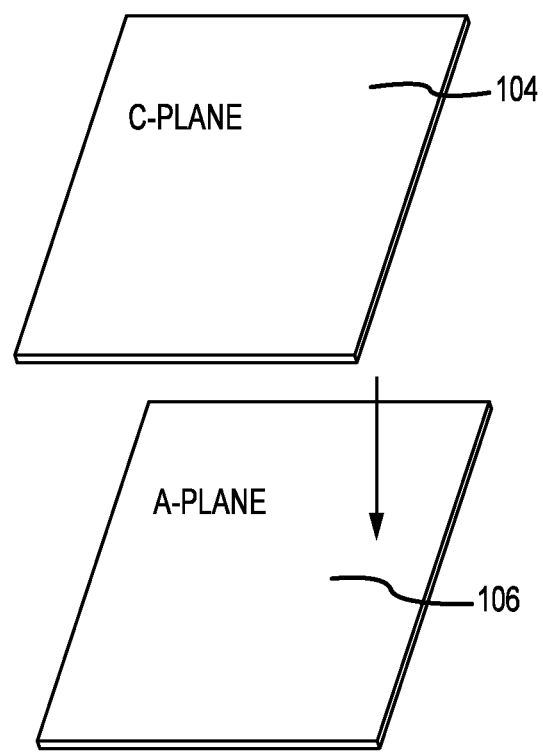
FIG. 2. illustrates two sheets of sapphire each having a different plane on the major surface prior to joining them together to form a sapphire structure.
Figure 3:
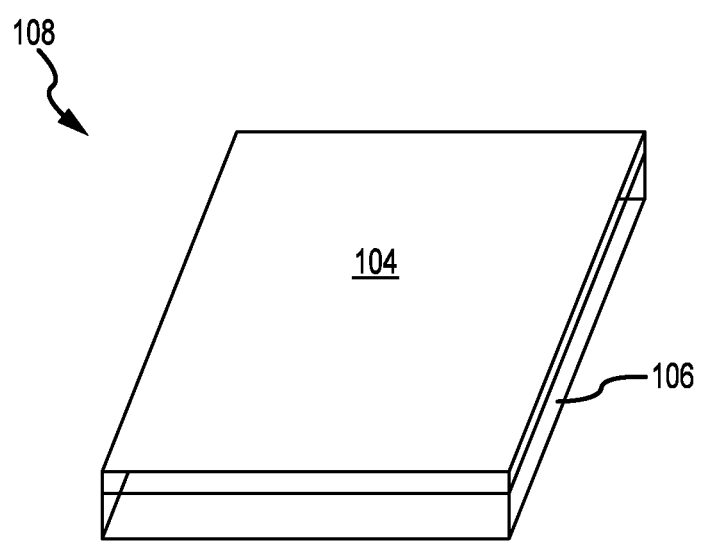
FIG. 3 illustrates the two sheets of sapphire of FIG. 2 joined together to form a sapphire structure.

FIG. 2 illustrates two sapphire sheets prior to fusing or adhering the sheets together. Each sheet may have a different plane in the major surface of the sheet. For example, a top sheet 104 may be a C-plane sheet and a lower sheet 106 may be an A-plane sheet. The C-plane may provide increased hardness, while the A-plane may provide a higher modulus of rupture. Thus, the combination of the two sheets may improve the hardness of the A-plane sheet and the strength of the C-plane sheet to provide an improved sapphire sheet over a sapphire sheet having only a single plane in the major surface. FIG. 3 shows the two sapphire sheets combined together to form the sapphire structure 108.

Figure 4:
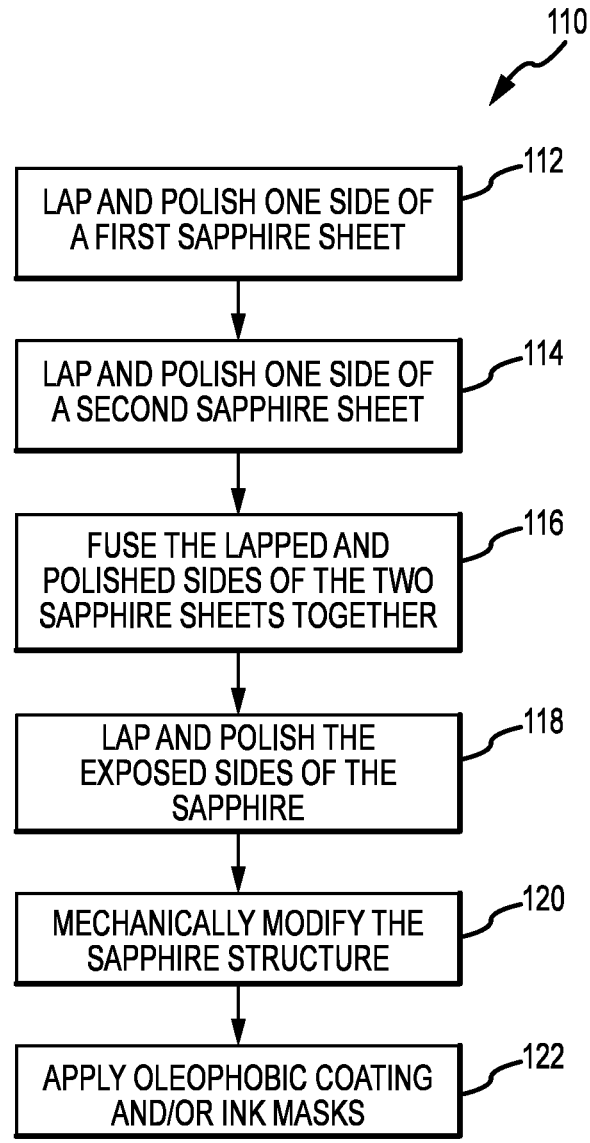
FIG. 4 is a flow chart illustrating the steps for creating the sapphire structure with two sapphire sheets.

FIG. 4 is a flowchart illustrating a method 110 for fusing two sapphire sheets together. Initially, a first side of a first sapphire sheet is lapped and polished (Block 112). A first side of a second sheet is then lapped and polished (Block 114). The first sides of the first and second sapphire sheets are polished to help reduce the likelihood of any defects or incongruities that may influence the optical properties of the sheets. The lapped and polished sides of the first and second sapphire sheets are then fused together to form a sapphire laminate (Block 116). The fusing of the sapphire sheets may occur at, near or above the melting temperature of sapphire. In some embodiments, the two sheets may be adhered together using an adhesive instead of being fused. In embodiments where adhesive is utilized, the adhesive may have an index of refraction approximately equal to or near that of sapphire to help eliminate or reduce any refraction that may occur as light passes through from one sapphire sheet, through the adhesive and into the other sapphire sheet.

Once the two sheets are joined together to form the sapphire laminate, the exposed surfaces of the sapphire laminate may be lapped and polished (Block 118). Both exposed surfaces of the sapphire laminate may be lapped and polished simultaneously. That is, the sapphire laminate may be immersed in an abrasive and/or polishing slurry with a polishing pad on each side. The sapphire structure may also be mechanically modified to help reduce the likelihood of chipping or fracturing. (Block 120). For example, the edges may be beveled or chamfered. Further, the sapphire structure may be treated with oleophobic coating and/or printed with ink (Block 122).

It should be appreciated that in some embodiments, one or more steps may be omitted and/or the order that the steps are performed may be changed. For example, in one embodiment, there is not post lamination lapping. That is, the individual sheets may be fully finished prior to lamination.

The resulting sapphire laminate may achieve both superior hardness and strength due to the use of multiple planes. The combination of these characteristics may allow the sapphire laminate to be handled at thicknesses less than one millimeter with a reduced likelihood of breakage. In one example, each sapphire sheet may have a thickness of approximately one millimeter to help reduce the likelihood of breakage through handling prior to creation of the sapphire laminate. After the sapphire laminate has been formed, it may be lapped and polished to a thickness less than one millimeter. The hardness and strength provided by the laminate may permit further handling with a reduced risk of breakage. The thinner laminate may be useful to help reduce the depth or thickness of products implementing the sapphire laminate.

Figure 5:
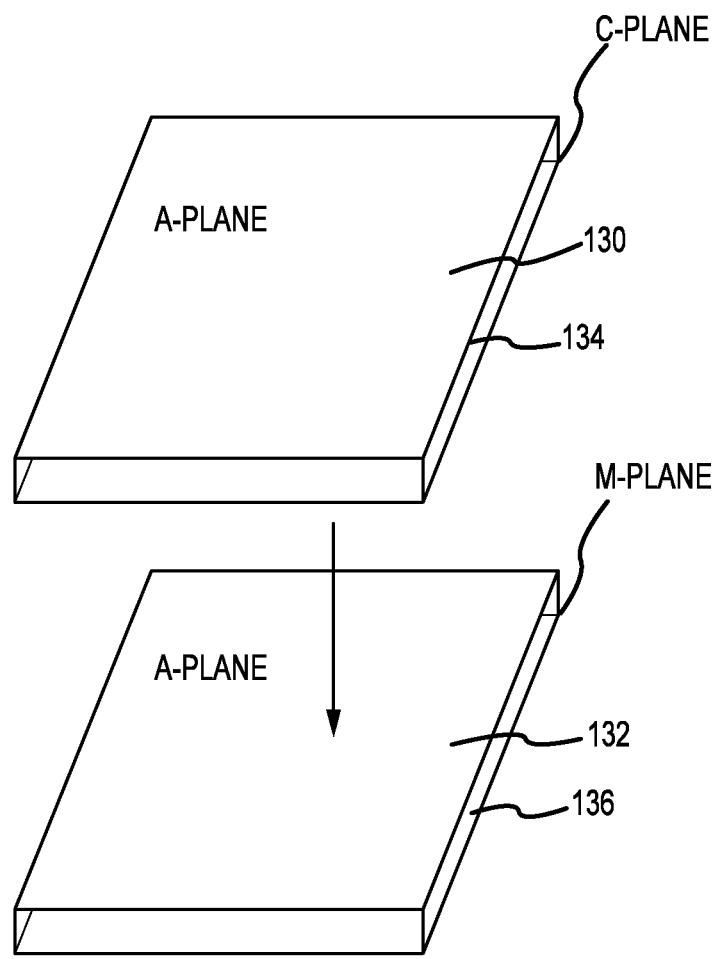
FIG. 5 illustrates two sheets of sapphire each having the same plane on the major surface but being oriented differently so that different planes are adjacent each other on the edge surface.

FIG. 5 illustrates another embodiment that takes the form of two sheets having the same plane of sapphire in their major surfaces. As used herein, the term major surface refers to the predominate plane of a sheet (e.g., the top or bottom surface of a sapphire sheet). In particular, two A-plane sheets of sapphire 130, 132 are shown. In this embodiment the A-plane sheets 130, 132 may be rotated relative to each other so that the edges 134, 136 are oriented to different planes. For example, the top sheet may have a C-plane along a right edge and the bottom sheet may have an M-plane along the right side. That is, a long axis of the top sheet 130 may be oriented in the C-plane, whereas the long axis of the bottom sheet 132 may be oriented in the M-plane. As such, a longitudinal axis of the sheets (as well as the axial axis) may be oriented at specific angles relative to the crystalline structure of the sapphire. In some embodiments, the edge of the sheets may not directly align with the crystalline structure. For example, the edge may be offset 10 degrees from the C-plane.

Figure 6:
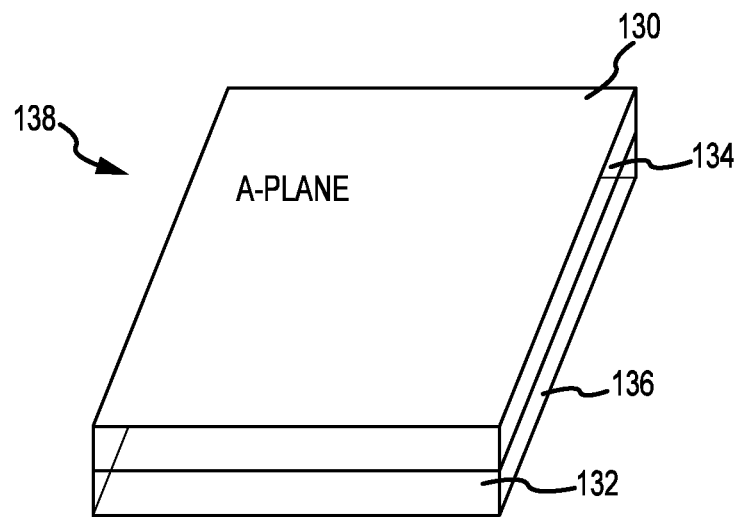
FIG. 6 illustrates the two sheets of sapphire of FIG. 5 joined together to form a sapphire structure.

Providing a diversity of planes along the edge may help improve the resilience of the edge of the sapphire structure. For example, as the edges may have different sapphire planes that may fracture along different lines and further may provide different hardness and strength characteristics, it is believed that the edges may be more resistant to breakage. More specifically, if one plane is more resistant to chipping while another is preferable for strength considerations, lamination of the sheets together provides an edge that may advantageously have reduced chipping and increased strength. FIG. 6 shows the sapphire structure 138 after the two sheets have been fused together.

Figure 7:
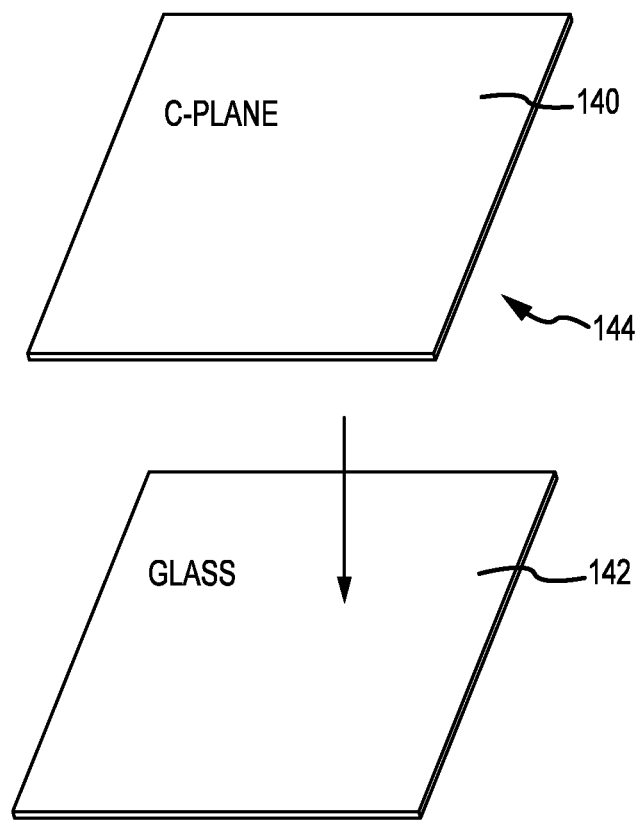
FIG. 7. illustrates a sapphire sheet and a glass sheet prior to laminating the glass sheet with the sapphire sheet.

FIG. 7 illustrates yet another embodiment with a sapphire sheet 140 and a glass sheet 142. One side 144 of the sapphire sheet 140 is lapped and polished. The glass sheet may also be polished. The polished side of the sapphire is then adhered to the glass sheet with adhesive. An adhesive having an index of refraction that is in between the index of refraction of sapphire and the index of refraction of glass may be used to help reduce any optical effects that may occur at or along the interface between the sapphire and the glass. Generally, a thin and hard bond is desired to be achieved by the optically clear adhesive. Some epoxies and liquid optically clear adhesives ("LOCAs") may be used as adhesives.

Although the embodiment is discussed as a sapphire laminate on glass, it should be appreciated that a sapphire laminate may be applied to a steel back plate, a plastic back plate or other material. In these embodiments, a thin hard bond achievable using epoxies and LOCAs may still be desired.

The second side of the sapphire (e.g., the exposed side of the sapphire) may then be further lapped and polished. The glass may also be lapped and polished. The lapping and polishing of glass and sapphire may be done in a single double-lapping procedure. As glass is softer than the sapphire, it will generally be thinned more quickly than the sapphire during the lapping process. To counteract the quicker lapping of the glass, in some embodiments, the glass layer may initially be much thicker than the sapphire, or the lapping pads may be of a different material. After lapping and polishing the combined sapphire and glass, the total thickness may be less than approximately one millimeter. In some embodiments, the total thickness may be less than or approximately one millimeter or less (e.g., approximately 0.9, 0.8, 0.7, 0.6, 0.5, or 0.4 millimeters or less). Lapping the glass and the sapphire sheets together may minimize the yield challenges associated with lapping and polishing a thin sapphire sheet alone. That is, sapphire sheets may be less susceptible to damage when lapped together with the glass.

A computer numerical control process may be performed on the sapphire laminated glass prior to lapping and polishing. Additionally, an edge polish may be performed for the adhesive and joint to smooth the joint and to further eliminate any visible effects resulting from the joinder of the glass and the sapphire.

In some embodiments, the glass may be chemically strengthened. The chemical strengthening may be performed prior to or after the glass and the sapphire are adhered together, since the sapphire will be mostly unaffected by the glass chemical strengthening process. Generally, the glass may be chemically strengthened after the glass has been polished. In some embodiments, a minor re-polish may be performed after the chemical strengthening. Further, the glass and the sapphire may be mechanically modified, for example, to have chamfered edges.

Utilizing a glass substrate for the sapphire may provide increased resiliency for the sapphire. That is, the glass may help reduce the likelihood of breakage of the sapphire sheet by reinforcing the sapphire. Additionally, the use of the glass substrate may allow for thinner sheets of sapphire to be utilized which may provide cost savings as less sapphire will be used on a per device basis and more sapphire sheets may be harvested from the boule as they may be sliced thinner.

Figure 8:
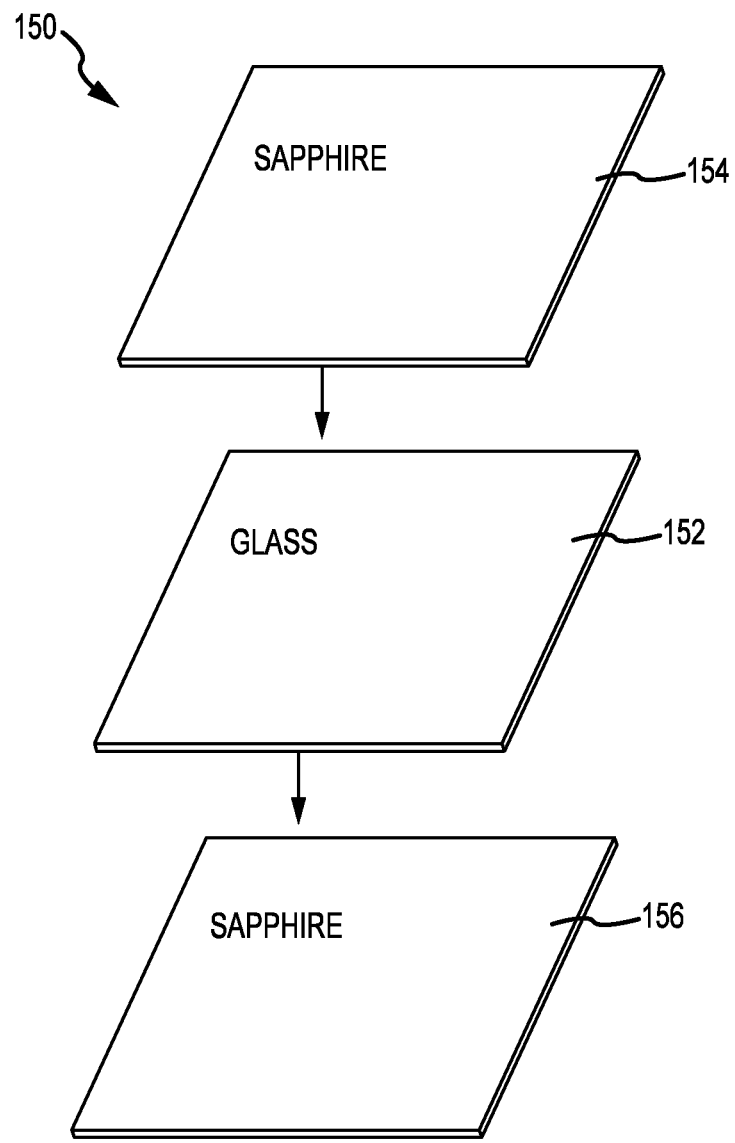
FIG. 8 illustrates a sapphire structure having a glass sheet in between two sapphire sheets.

FIG. 8 illustrates a sapphire structure 150 having a glass sheet 152 in between two sapphire sheets 154, 156. The sapphire structure 150 may be configured to serve in a variety of different capacities. For example, the sapphire structure 150 may serve as a cover glass in a consumer electronic device, such as a smart phone, a tablet computer, a camera, and so forth. In some implementations, it may be advantageous for the sapphire structure to be thin. As such, it may be approximately 1.5 mm or thinner. For example, the sapphire structure may be approximately 1.4 mm, 1.3 mm, 1.2 mm, 1.1 mm, 1.0 mm, or thinner. Additionally, the various sheets may be adhered together in any suitable manner to form the structure.

In some embodiments, the sapphire sheets 154, 156 may have the same crystallographic orientation in their major surfaces. That is, each of the sapphire sheets may each be C-plane or A-plane sapphire. Although, in alternative embodiments, the sapphire sheets may each have different orientations in their major surface. For example, a first sheet 154 may be C-plane sapphire and the second sheet 156 may be A-plane sapphire.

Further, as discussed above, a secondary orientation of the sapphire sheets may vary with respect to each other to take advantage of the unique characteristics of the different planes of sapphire. For example, the first sheet 154 may have a secondary orientation that provides chipping resistance, whereas the second sheet 156 may have an orientation that is advantageous for strength. It should be appreciated that the secondary orientations may be selected to provide specific characteristics to a particular side or edge of the sapphire structure, as discussed above. Additionally, it should be appreciated that the secondary orientation may be offset an angle from the edge of the structure in some embodiments. That is, the crystallographic orientation of the sapphire sheets may be at an angle relative to the edge of the structure. For example, it may be offset an angle approximately 45 degrees from the long side of the structure. It should be appreciated that the offset angle may be any suitable angle between 0 and 90 degrees.

The foregoing describes some example embodiments of sapphire structure and laminates. Although the foregoing discussion has presented specific embodiments, persons skilled in the art will recognize that changes may be made in form and detail without departing from the spirit and scope of the embodiments. In particular, certain processes and/or treatments described above with respect one embodiment may be implemented with other embodiments. Accordingly, the specific embodiments described herein should be understood as examples and not limiting the scope thereof.

We claim:

1. An electronic device, comprising:
   a housing having a height, a width greater than the height, and a length greater than the width; and
   a cover glass, comprising:
      a first sapphire sheet that is a single crystal structure having a first major surface and a second major surface opposite the first major surface, each surrounded by four minor surfaces, including two first minor surfaces parallel to the length of the housing and two second minor surfaces parallel to a width of the housing, the first sapphire sheet configured to receive a touch input; and
      a second sapphire sheet that is a single crystal structure having a third major surface and a fourth major surface opposite the third major surface, each surrounded by four additional minor surfaces, including two third minor surfaces parallel to the length of the housing and two fourth minor surfaces parallel to a width of the housing, the second sapphire sheet configured to couple to the housing; and
      an adhesive in direct contact with the second major surface of the first sapphire sheet and the third major surface of the second sapphire sheet and bonding the first sapphire sheet to the second sapphire sheet, wherein:
      the first major surface of the first sapphire sheet has a first sapphire crystallographic plane orientation and the third major surface of the second sapphire sheet has a second sapphire crystallographic plane orientation that differs from the first sapphire crystallographic plane orientation
      the two first minor surfaces and the two second minor surfaces of the first sapphire sheet are coplanar with the two third minor surfaces and the two fourth minor surfaces of the second sapphire sheet, respectively; and
      a sapphire crystallographic plane orientation of the two first minor surfaces of the first sapphire sheet is different from a sapphire crystallographic plane orientation of the two third minor surfaces of the second sapphire sheet.

2. The electronic device of claim 1, wherein the cover glass is less than 1 mm thick.

3. The electronic device of claim 1, wherein the cover glass comprises a chamfered edge, the chamfered edge comprises one of a rounded chamfer or an angled chamfer.

4. An electronic device comprising:
a cover having a height, a width greater than the height, and a length greater than the width and comprising a sapphire structure, the sapphire structure comprising:
a first sapphire sheet that is a single sapphire crystal, the first sapphire sheet having a first major surface defining a user input surface and a second major surface opposite the first major surface;
a second sapphire sheet that is a single sapphire crystal having a third major surface and a fourth major surface opposite the third major surface, the second sapphire sheet joined to the first sapphire sheet along a bonding interface that is parallel with the second major surface of the first sapphire sheet and the third major surface of the second sapphire sheet, the second sapphire sheet configured for engagement with a separate component of the electronic device along the fourth major surface; and
an adhesive directly contacting the second major surface of the first sapphire sheet and the third major surface of the second sapphire sheet, wherein:
the first major surface of the first sapphire sheet and the third major surface of the second sapphire sheet have a common sapphire crystallographic plane orientation;
the first and second sapphire sheets each have four minor surfaces;
each of the minor surfaces of the first sapphire sheet is coplanar with a corresponding one of the minor surfaces of the second sapphire sheet; and
at least one of the minor surfaces of the first sapphire sheet and at least one of the minor surfaces of the second sapphire sheet are parallel to the length of the cover and have different sapphire crystallographic plane orientations.

5. The electronic device of claim 4, wherein the cover comprises at least one of:
a cover glass;
a back plate; or
a lens for a camera.

6. An electronic device comprising:
a cover glass having a height, a width orthogonal to the height, and a length orthogonal to the width, the cover glass comprising:
a first sapphire sheet that is a single crystal and including a first major surface, a second major surface opposite the first major surface, and four minor surfaces surrounding the first and second major surfaces and including two first minor surfaces parallel to the length of the cover glass and two second minor surfaces parallel to a width of the cover glass, the first sapphire sheet positioned at an exterior of the electronic device;
a second sapphire sheet that is a single crystal and including a third major surface, a fourth major surface opposite the third major surface, and four additional minor surfaces surrounding the third and fourth major surfaces and including two third minor surfaces parallel to the length of the cover glass and two fourth minor surfaces parallel to the width of the cover glass; and
an adhesive in direct contact with the second major surface of the first sapphire sheet and the third major surface of the second sapphire sheet, wherein:
the first major surface of the first sapphire sheet and the third major surface of the second sapphire sheet have a common sapphire crystallographic plane orientation;
the two first minor surfaces and the two second minor surfaces of the first sapphire sheet are coplanar with the two third minor surfaces and the two fourth minor surfaces of the second sapphire sheet, respectively; and
a sapphire crystallographic plane orientation of the two first minor surfaces of the first sapphire sheet is different from a sapphire crystallographic plane orientation of the two third minor surfaces of the second sapphire sheet.

7. The electronic device of claim 6, wherein:
the first major surface of the first sapphire sheet of the cover glass includes a lapped and polished surface; and
the third major surface of the second sapphire sheet of the cover glass includes a lapped and polished surface.

8. The electronic device of claim 6, wherein:
the second major surface of the first sapphire sheet of the cover glass includes a lapped and polished surface; and
the fourth major surface of the second sapphire sheet of the cover glass includes a lapped and polished surface.

9. The electronic device of claim 6, further comprising an oleophobic coating on at least one of the first sapphire sheet or the second sapphire sheet of the cover glass.

10. The electronic device of claim 6, further comprising an ink coating on at least one of the first sapphire sheet or the second sapphire sheet of the cover glass.

11. The electronic device of claim 6, wherein the adhesive includes an index of refraction approximately equal to an index of refraction of at least one of the first sapphire sheet or the second sapphire sheet of the cover glass.

* * * * *